US007675335B1

(12) United States Patent
Cheng

(10) Patent No.: US 7,675,335 B1
(45) Date of Patent: Mar. 9, 2010

(54) PHASE DETECTING MODULE AND RELATED PHASE DETECTING METHOD

(75) Inventor: Wen-Chang Cheng, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/407,787

(22) Filed: Mar. 19, 2009

(30) Foreign Application Priority Data

Feb. 4, 2009 (TW) ............................ 98103484 A

(51) Int. Cl.
*H03L 7/00* (2006.01)

(52) U.S. Cl. ............................ 327/160; 327/3; 327/5; 327/7; 327/12; 327/147; 327/151; 327/157; 331/14; 331/17; 331/25; 331/1 A

(58) Field of Classification Search .................... 327/2, 327/3, 5, 7–10, 12, 141, 142, 144–153, 155–163; 331/14, 17, 18, 25, 1 A
See application file for complete search history.

(56) References Cited

U.S. PATENT DOCUMENTS 7,605,662 B2 * 10/2009 Kobayashi et al. ............ 331/11

* cited by examiner

*Primary Examiner*—Lincoln Donovan
*Assistant Examiner*—Patrick O'Neill
(74) *Attorney, Agent, or Firm*—Winston Hsu

(57) ABSTRACT

A phase detecting module includes a phase detecting unit, a comparator and a counter. The phase detecting unit is arranged to compare a first input signal and a second input signal to generate a phase detecting result. The comparator is arranged to compare the phase detecting result and a predetermined voltage to generate a comparing result. The counter is arranged to count one of the first input signal and the second input signal to generate a counting value. The phase detecting result and the counting value are reset if the counting value reaches a predetermined value, and the comparing result is outputted to a target device from the comparator if the counting value reaches a predetermined value.

12 Claims, 4 Drawing Sheets

CS=1, 209 Conducting, 211 non-conducting
CS=0, 209 Non-conducting, 211 conducting

PHASE DETECTING MODULE AND RELATED PHASE DETECTING METHOD

BACKGROUND OF THE INVENTION

1. Field of the Invention

The present invention relates to a phase detecting module and phase detecting method thereof, and more particularly, to a phase detecting module capable of avoiding noise influence and a phase detecting method thereof.

2. Description of the Prior Art

Many signal processing circuits, e.g., phase locked loops (PLLs), usually comprise phase detectors each implemented for determining a phase relationship between two signals, and transmit the comparing result generated from the phase detector to other signal processing units for further processing.

FIG. 1 is a block diagram illustrating a PLL 100 according to the prior art. As shown in FIG. 1, the conventional PLL 100 usually includes a phase detector 101, a charge pump 103, a low pass filter (LPF) 105, a voltage-controlled oscillator (VCO) 107, and a plurality of frequency dividers 109 and 111. The frequency divider 111 is for frequency-dividing an input signal IS which has an input frequency Fin to form a reference signal RS which has a reference frequency Fr. The phase detector 101 is for comparing the reference signal RS with an output signal OUS which has an output frequency Fou to generate a phase detecting signal DS. The charge pump 103 determines to increase or decrease outputted charges according to the phase detecting signal DS which could be an up signal or a down signal. The voltage outputted by the charge pump 103 is processed via the LPF 105 to form a filtered control voltage $V_{CF}$, and the VCO 107 thereby determines the outputted oscillation signal OS which has an oscillation frequency Fo according to the control signal $V_{CF}$. The frequency divider 109 frequency-divides the oscillation signal OS to form the output signal OUS. As other detailed architecture and operations should be readily comprehended by those skilled in the art, further description is omitted for succinctness.

From the aforementioned description, the charge pump 103 primarily operates to raise or lower a following voltage according to the phase detecting result generated from the phase detector 101. However, when the phase difference between two signals is very small, the phase detector 101 will not be able to determine the phase relationship between the two signals due to the noise or jitter attached onto the two signals, leading to a problem in the following signal processing.

SUMMARY OF THE INVENTION

Therefore, one of the objectives of the present invention is to provide a phase detecting module capable of avoiding misjudging the relationship between two signals due to noise or jitter attached onto the two signals.

In one embodiment of the present invention, a phase detecting module is disclosed. The phase detecting module includes a phase detecting unit, a comparator and a counter. The phase detecting unit is for comparing a first input signal and a second input signal to generate a phase detecting result. The comparator, coupled to the phase detecting unit, is for comparing the phase detecting result and a predetermined voltage to generate a comparing result. The counter is for counting one of the first input signal and the second input signal to generate a counting value, wherein the phase detecting result and the counting value are reset when the counting value reaches a predetermined value, and the comparing result is outputted to a target device from the comparator when the counting value reaches the predetermined value.

In another embodiment of the present invention, a phase detecting method is disclosed. The phase detecting method includes: (a) comparing a first input signal and a second input signal to generate a phase detecting result; (b) comparing the phase detecting result with a predetermined voltage to generate a comparing result; and (c) counting one of the first input signal and the second input signal to generate a counting value, wherein the phase detecting result and the counting value are reset when the counting value reaches a predetermined value, and the comparing result is outputted to a target device when the counting value reaches the predetermined value.

From the aforementioned embodiments, an influence from noise or jitter can be eliminated, and therefore a phase difference between two signals can be accurately detected.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
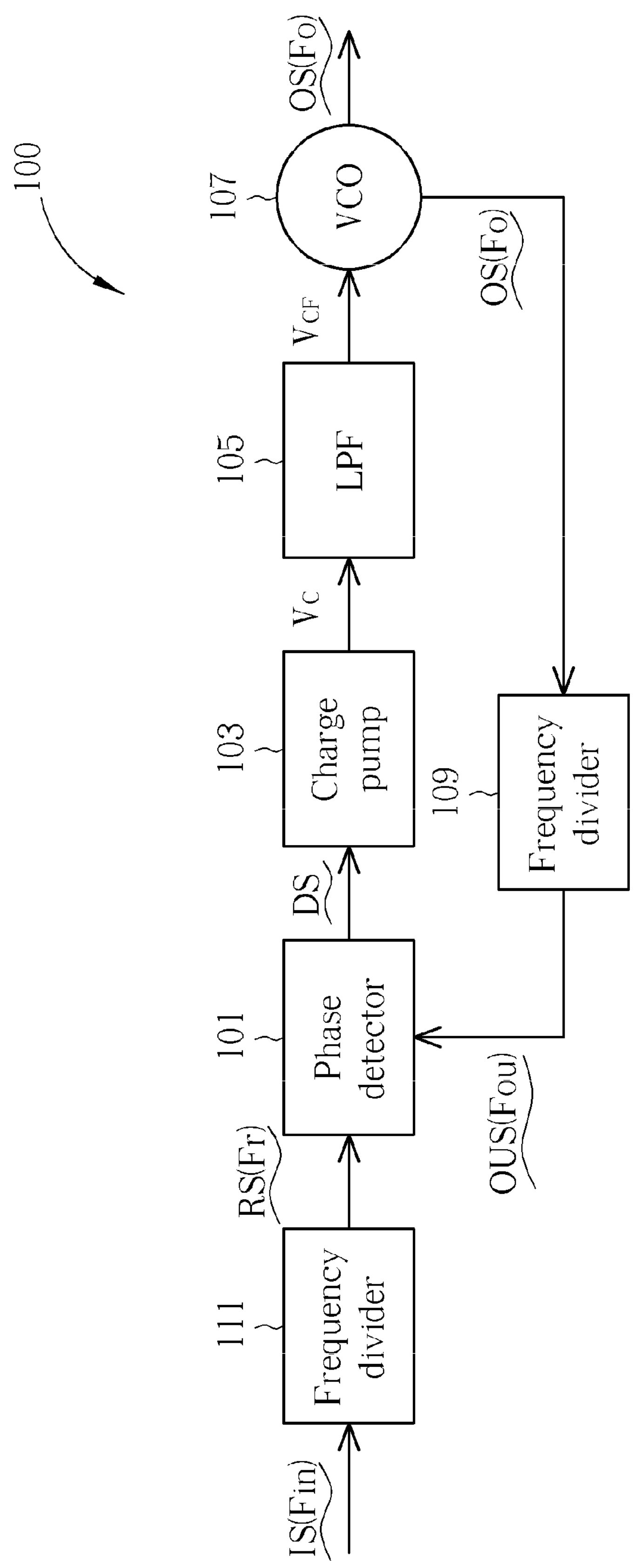
FIG. 1 is a diagram illustrating a block diagram of a PLL circuit according to the prior art.
Figure 2:
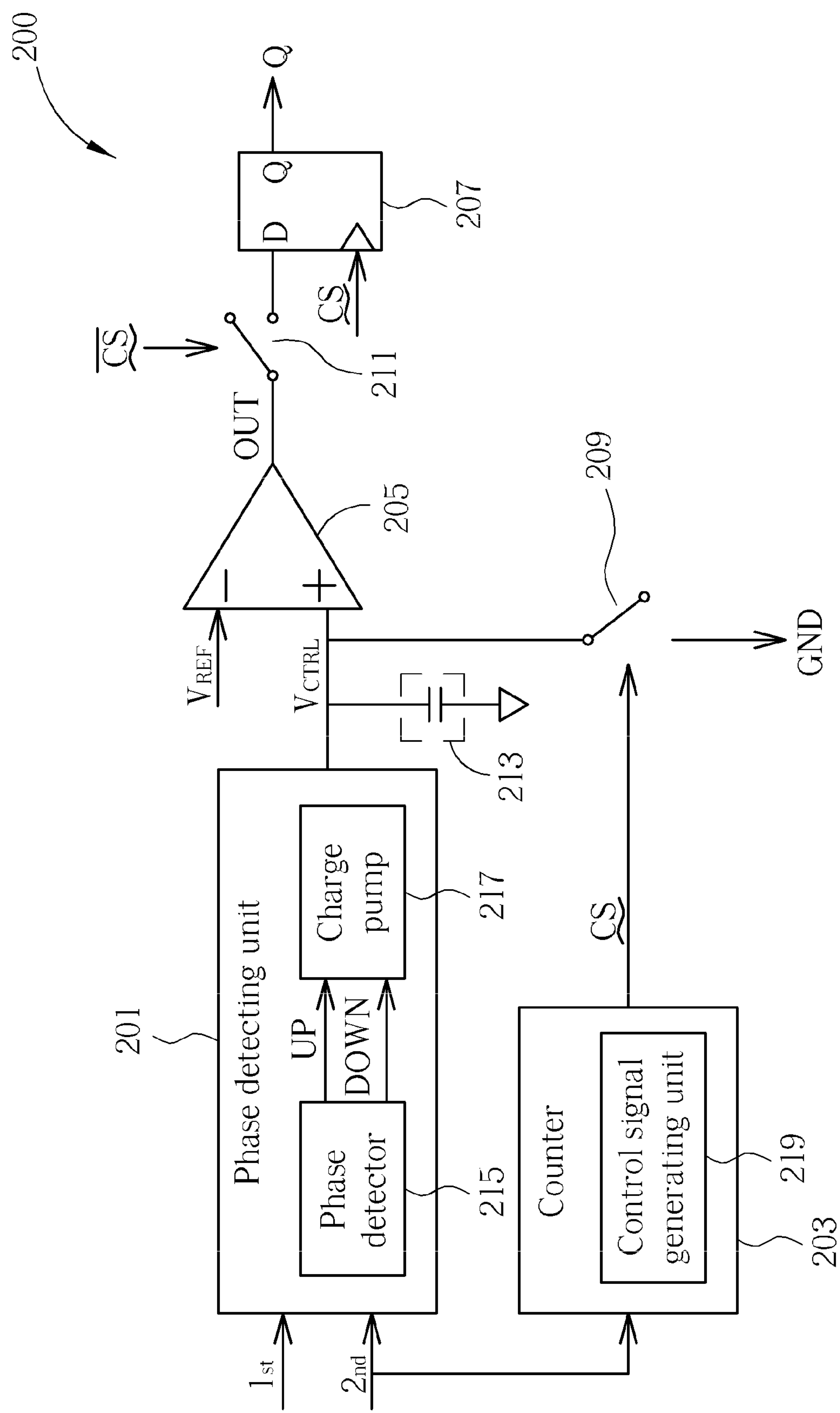
FIG. 2 is a diagram illustrating a phase detecting module according to an embodiment of the present invention.

FIG. 2 is a diagram illustrating a phase detecting module 200 according to an embodiment of the present invention. As shown in FIG. 2, the phase detecting module 200 includes a phase detecting unit 201, a counter 203, a comparator 205, a D flip-flop 207 (which can also be viewed as a register), a first switch 209, a second switch 211 and a capacitor 213. The phase detecting unit 201 is for comparing a first input signal $\mathbf{1}_{st}$ and a second input signal $\mathbf{2}_{nd}$ to generate a phase detecting result. In this embodiment, the phase detecting result is a control voltage $V_{CTRL}$ which is generated in response to a phase difference between the first input signal $\mathbf{1}_{st}$ and the second input signal $\mathbf{2}_{nd}$, and is used to charge/discharge the capacitor 213. In addition, the phase detector 201 includes a phase detector 215 and a charge pump 217. The phase detector 215 compares the first input signal $\mathbf{1}_{st}$ and the second input signal $\mathbf{2}_{nd}$, and outputs an up signal UP or a down signal DOWN to the charge pump 217 according to a phase difference between the first input signal $1_{st}$ and the second input signal $2_{nd}$. Next, based on an output of the phase detector 215, the charge pump 217 will charge or discharge the capacitor 213 accordingly.

The comparator 205 is for comparing the phase detecting result (i.e., $V_{CTRL}$) with a predetermined voltage $V_{REF}$ to generate a comparing result OUT. The counter 203 is for counting one of the first input signal $1_{st}$ and the second input signal $2_{nd}$ (e.g., the second input signal $2_{nd}$ in this embodiment) to generate a counting value, wherein the phase detecting result is reset (i.e., the capacitor 213 is grounded via the first switch 209) as well as the counting value when the counting value reaches a predetermined value, and the comparing result OUT is outputted to a target device (e.g., the D flip-flop 207 in this example) from the comparator 205 via the second switch 211 when the counting value reaches a predetermined value.

Figure 3:
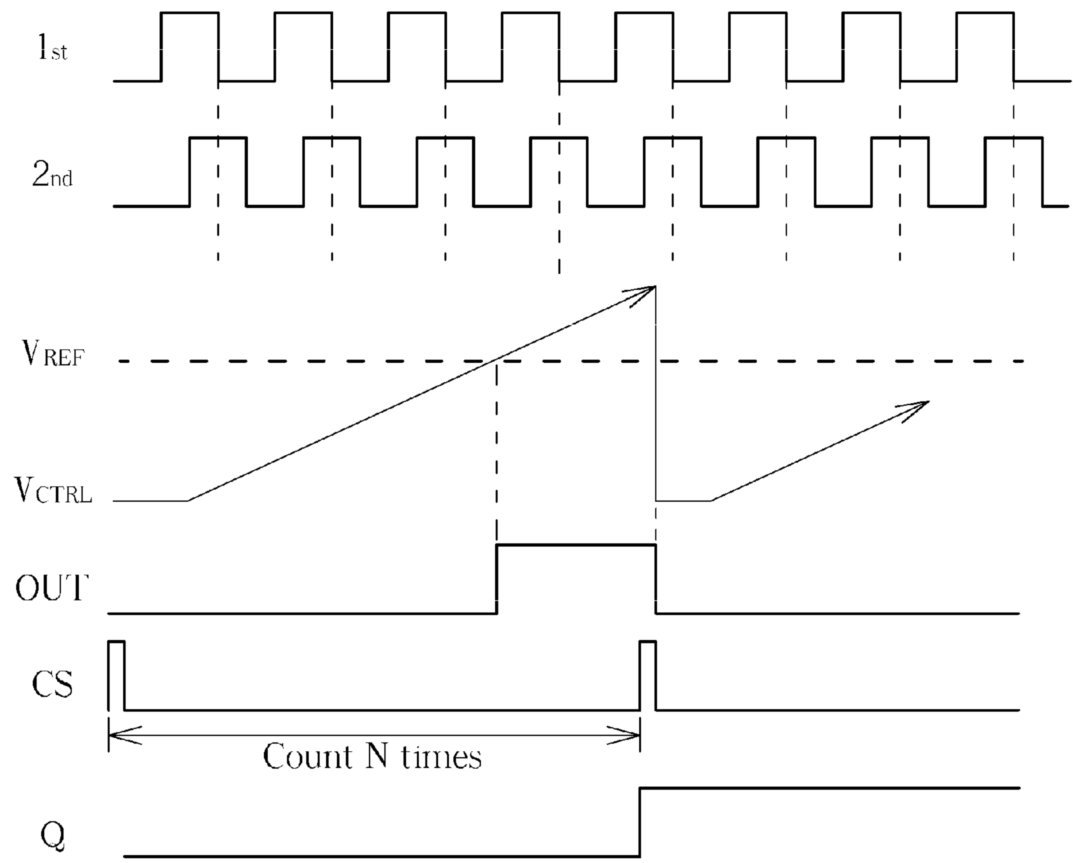
FIG. 3 is a diagram illustrating signals of a phase detecting module according to an embodiment of the present invention.

FIG. 3 is a diagram illustrating signals of the phase detecting module 200 according to an embodiment of the present invention. Please refer to FIG. 3 in conjunction with FIG. 2 to acquire further comprehension of the phase detecting module proposed in the embodiment of the present invention. In the circuit shown in FIG. 2, the phase of the first input signal $1_{st}$ leads the phase of the second input signal $2_{nd}$, and therefore the phase detecting unit 201 charges the capacitor 213 continuously to raise the control voltage $V_{CTLL}$. When the control voltage $V_{CTRL}$ is lower than the predetermined voltage $V_{REF}$, the comparing result OUT becomes “0” (i.e., a low level); on the other hand, when the control voltage $V_{CTRL}$ is higher than the predetermined voltage $V_{REF}$, the comparing result OUT becomes “1” (i.e., a high level).

A control signal CS has a first level (“1” in this example) and a second level (“0” in this example). When the control signal CS is “1”, the first switch 209 is conducting and the second switch 211 is non-conducting; when the control signal is “0”, the first switch 209 is non-conducting and the second switch 211 is conducting. As shown in FIG. 2 and FIG. 3, the counter 203 counts a number of periods of the second input signal $2_{nd}$. After a counting value obtained by the counter 203 reaches a predetermined number (e.g., an integer N), a pulse with a level “1” is generated and then swiftly pulled back to a level “0”; in addition, the counting value is reset to zero. That is, under a general condition, the control signal CS is “0”, and the first switch 209 is non-conducting while the second switch 211 is conducting. As a result, the comparing result OUT is outputted to the D flip-flop 207 and then stored, as indicated by a signal Q shown in FIG. 3.

After the counter 203 counts a predetermined value (e.g., an integer N), the control signal CS becomes “1”, and the capacitor 213 will be grounded (i.e., coupled to a predetermined voltage) to make the control voltage $V_{CTRL}$ become 0 (i.e., the phase comparing result is reset). Meanwhile, the second switch 211 is non-conducting and therefore the comparing result OUT will not be output, and the D flip-flop 207 also latches the comparing result OUT. Afterward, the control signal CS will have a transition from level “1” to level “0” again, and the comparing result OUT will once more be output to the D flip-flop 207 and then stored. As described before, noise or jitter attached to signals might charge/discharge the capacitor 213 unnecessarily, which leads to an error in the control voltage $V_{CTRL}$. With the help of the aforementioned mechanism capable of resetting the control voltage $V_{CTRL}$ after a period of time, a misjudgment resulting from an error caused by long-term accumulated unnecessary charging/discharging can be avoided.

Figure 4:
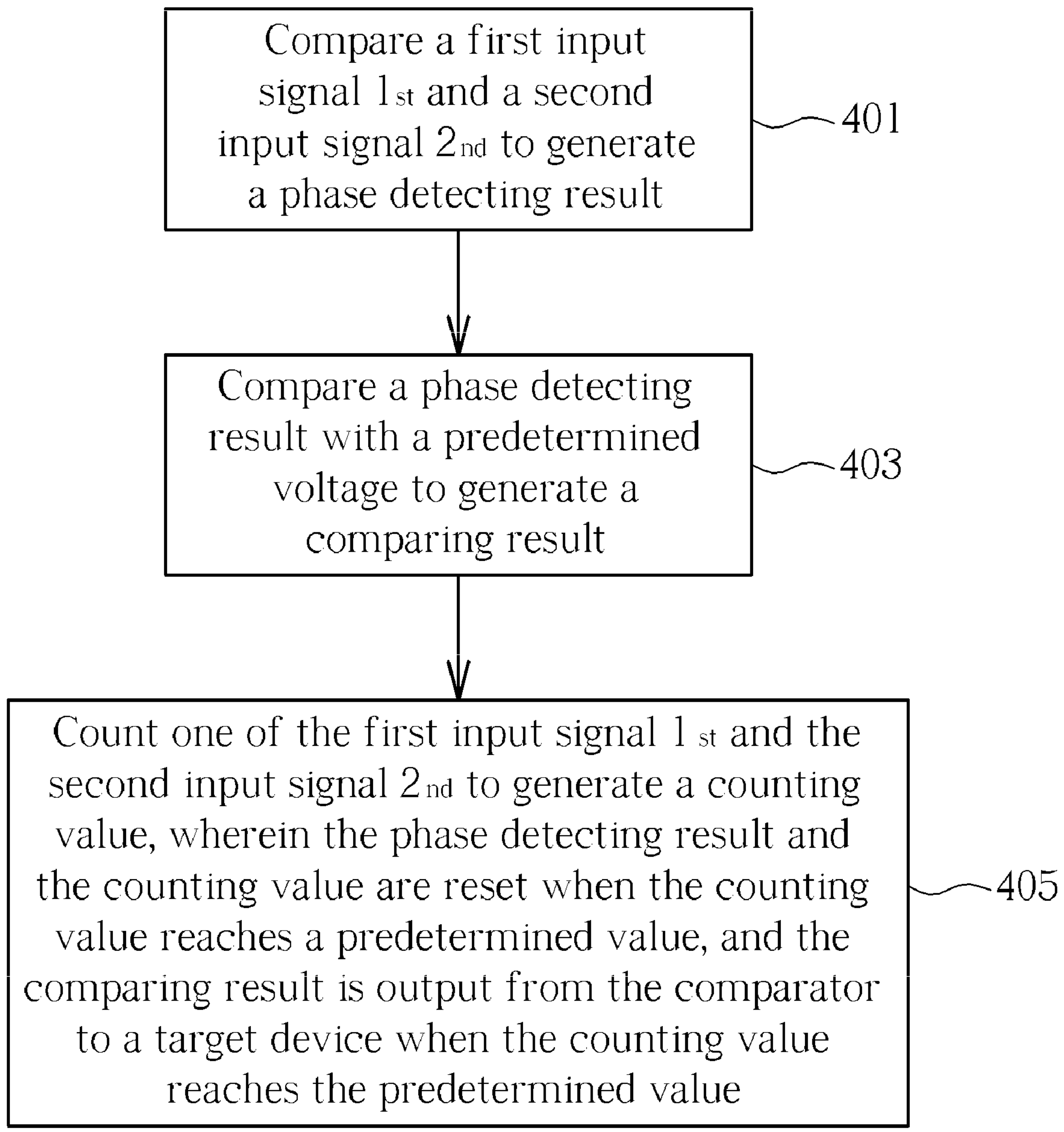
FIG. 4 is a diagram illustrating a flowchart of a phase detecting method according to an embodiment of the present invention.

FIG. 4 is a flowchart of a phase detecting method according to an embodiment of the present invention. As shown in FIG. 4, the phase detecting method according to the embodiment of the present invention includes the following steps:

Step 401: Compare a first input signal $1_{st}$ and a second input signal $2_{nd}$ to generate a phase detecting result.

Step 403: Compare a phase detecting result with a predetermined voltage to generate a comparing result.

Step 405: Count one of the first input signal $1_{st}$ and the second input signal $2_{nd}$ to generate a counting value, wherein the phase detecting result and the counting value are reset when the counting value reaches a predetermined value, and the comparing result is output from the comparator to a target device when the counting value reaches the predetermined value.

As details of the phase detecting method according to the embodiment of the present invention are illustrated thoroughly in FIG. 2 and FIG. 3, further description is not repeated here for the sake of brevity.

From the aforementioned embodiments, the influence of noise or jitter can be eliminated and the phase difference between two signals can be detected accurately.

Those skilled in the art will readily observe that numerous modifications and alterations of the device and method may be made while retaining the teachings of the invention.

What is claimed is:

1. A phase detecting module, comprising:

a phase detecting unit, for comparing a first input signal and a second input signal to generate a phase detecting result;

a comparator, coupled to the phase detecting unit, for comparing the phase detecting result and a predetermined voltage to generate a comparing result; and a counter, for counting one of the first input signal and the second input signal to generate a counting value, wherein the phase detecting result and the counting value are reset when the counting value reaches a predetermined value, and the comparing result is output from the comparator to a target device when the counting value does not reach the predetermined value.

2. The phase detecting module of claim 1, wherein the phase detecting unit comprises:

a capacitor;

a phase detector, for generating an up signal or a down signal according to the first input signal and the second input signal; and a charge pump, for charging/discharging the capacitor according to the generated up signal or down signal to generate the phase detecting result;

wherein the capacitor is coupled to a predetermined voltage level to reset the phase detecting result when the counting value reaches the predetermined value.

3. The phase detecting module of claim 2, further comprising:

a first switch, coupled to the capacitor and the predetermined voltage level, the first switch being in a non-conducting state when the counting value does not reach the predetermined value, and being in a conducting state to reset the phase detecting result when the counting value reaches the predetermined value; and a second switch, coupled to an output port of the comparator, the second switch being in a non-conducting state when the counting value reaches the predetermined value, and being in a conducting state to output the comparing result to the target device when the counting value does not reach the predetermined value.

4. The phase detecting module of claim 3, further comprising:

a control signal generating unit, coupled to the counter, for generating a control signal according to the counting value;

wherein the control signal has a first level when the counting value reaches the predetermined value, and has a second level when the counting value does not reach the predetermined value; when the control signal has the first level, the first switch is conducting and the second switch is non-conducting; and when the control signal has the second level, the first switch is non-conducting and the second switch is conducting.

5. The phase detecting module of claim 3, wherein the target device is a register for storing the comparing result when the second switch is conducting and for latching the comparing result stored therein when the second switch is non-conducting.

6. The phase detecting module of claim 5, wherein the register is a D flip-flop.

7. A phase detecting method, comprising:

(a) comparing a first input signal and a second input signal to generate a phase detecting result;

(b) comparing the phase detecting result with a predetermined voltage to generate a comparing result; and (c) counting one of the first input signal and the second input signal to generate a counting value, wherein the phase detecting result and the counting value are reset when the counting value reaches a predetermined value, and the comparing result is output to a target device when the counting value does not reach the predetermined value.

8. The phase detecting method of claim 7, wherein the step (a) comprises:

generating an up signal or a down signal according to the first input signal and the second input signal; and charging/discharging a capacitor according to the generated up signal or down signal to generate the phase detecting result;

wherein the capacitor is coupled to a predetermined voltage level to reset the phase detecting result when the counting value reaches the predetermined value.

9. The phase detecting method of claim 8, further comprising:

providing a first switch and coupling the first switch to the capacitor and a predetermined voltage level, wherein the first switch is in a non-conducting state when the counting value does not reach the predetermined value, and is in a conducting state to reset the phase detecting result when the counting value reaches the predetermined value;

providing a second switch, wherein the second switch is in a non-conducting state when the counting value reaches the predetermined value, and is in a conducting state to output the comparing result to the target device when the counting value does not reach the predetermined value.

10. The phase detecting method of claim 9, further comprising:

generating a control signal according to the counting value;

wherein the control signal has a first level when the counting value reaches the predetermined value, and has a second level when the counting value does not reach the predetermined value; when the control signal has the first level, the first switch is conducting and the second switch is non-conducting; and when the control signal has the second level, the first switch is non-conducting and the second switch is conducting.

11. The phase detecting method of claim 9, wherein the target device is a register for storing the comparing result when the second switch is conducting and for latching the comparing result stored therein when the second switch is non-conducting.

12. The phase detecting method of claim 11, wherein the register is a D flip-flop.

* * * * *